United States Patent [19]

Osann, Jr.

[11] 4,220,924
[45] Sep. 2, 1980

[54] DIGITAL PHASE DECODING TECHNIQUE FOR QUADRATURE PHASED SIGNALS

[76] Inventor: Robert Osann, Jr., 22483 Riverside Dr., Cupertino, Calif. 95014

[21] Appl. No.: 887,072

[22] Filed: Mar. 16, 1978

Related U.S. Application Data

[63] Continuation-in-part of Ser. No. 713,854, Aug. 12, 1976, Pat. No. 4,079,251.

[51] Int. Cl.$^2$ ............................................. H03K 13/00
[52] U.S. Cl. ..................................... 328/119; 328/151; 328/166; 328/133
[58] Field of Search ................ 328/133, 166, 151, 119

[56] References Cited

U.S. PATENT DOCUMENTS

| | | | |
|---|---|---|---|
| 3,671,871 | 6/1972 | Malm | 328/166 X |
| 3,710,265 | 1/1973 | Gray | 328/166 X |
| 4,037,116 | 7/1977 | Hodama | 328/133 X |

Primary Examiner—John S. Heyman

[57] ABSTRACT

A phase decoding technique is provided which, when applied to a pair of quadrature-phased digital-electronic signals (i.e. having a 90° phase relationship) such as those normally associated with incremental optical position encoders, produces signals suitable for incrementing or decrementing up-down counters in accordance with the phase relationship and pulse rate of these quadrature phased signals. This is accomplished through circuitry which is entirely of a digital nature and relys on comparisons of samples of the quadrature-phased signals which are taken and stored in a time-sequential manner. Since no analog circuitry is employed, the disadvantages of phase decoders using prior art techniques are avoided.

1 Claim, 3 Drawing Figures

DIGITAL PHASE DECODING TECHNIQUE FOR QUADRATURE PHASED SIGNALS

BACKGROUND OF THE INVENTION

This application is a continuation-in-part of my co-pending application, Ser. No. 713,854, now U.S. Pat. No. 4,079,251, filed Aug. 12, 1976, in which I disclosed a system base on an incremental-optical encoder where the light emitter was pulsed and the quadrature outputs from the photodetectors were sampled, the overall objective being to redude system power consumption to facilitate operation on battery power for extended periods.

Reference was made in the previously mentioned application to-prior art methods for decoding the quadrature-phased signals which are derived from the photodetectors of an incremental optical encoder. These decoders typically rely on a combination of Analog and Digital techniques where the rising and/or falling edges of the quadrature waveforms are detected, and in accordance with this detection one-shot type pulses are generated either by a conventional analog method or by a digital gate-delay technique, these pulses either becoming the decoder outputs or setting and resetting flip-flops which in turn become the decoder outputs. As these one-shot type pulses must have a finite width, there is an inherent possibility for false counts to occur under certain conditions of mechanical movement of the optomechanical system of the encoder.

In the previously mentioned co-pending application, a phase decoding technique was presented which overcame the deficiencies of the prior art methods by providing a purely digital technique which is in fact applicable not only to an encoder system such as the one previously presented, but to any pair of quadrature phased electronic signals from which rate and direction information must be derived.

BRIEF DESCRIPTION OF THE INVENTION

In accordance with the present invention, the digital phase-decoding technique used in the invention of co-pending application Ser. No. 713,854, now U.S. Pat. No. 4,079,251, is presented as an independent entity which is suitable for decoding any pair of quadrature phased electronic signals as long as the maximum frequency of-said quadrature phased signals does not exceed one-fourth the sampling frequency utilized in the decoder circuitry.

More specifically the present invention comprises an oscillator, digital registers, and a static (i.e. pre-programmed and un-alterable) digital memory to perform a time-sequential analysis of the quadrature signals which are fed to it. As a result of this analysis, decoded count pulses are provided which drive up/down digital counters.

The foregoing and other features and objects of the invention will be pointed out more particularly and will become more apparent from the following more detailed description of the invention taken in conjunction with the accompanying drawings which form an integral part thereof.

DESCRIPTION OF THE PREFERRED EMBODIMENTS

Inasmuch as a sampling technique was already being employed to accomplish the main goal of the invention of the previously mentioned co-pending application and subsequent U.S. Patent, (that of reduced power consumption), a phase decoding method which also employs a sampling technique was easily integrated into that system.

This new phase decoding method was disclosed in FIG. 15 of the co-pending application and can function as a separate entity with the obvious addition of an oscillator to produce the sampling pulses. Accordingly a diagrammatic representation of the present invention embodied as a separate entity is shown in FIG. 1 of the accompanying drawings.

Figures 1, 2:
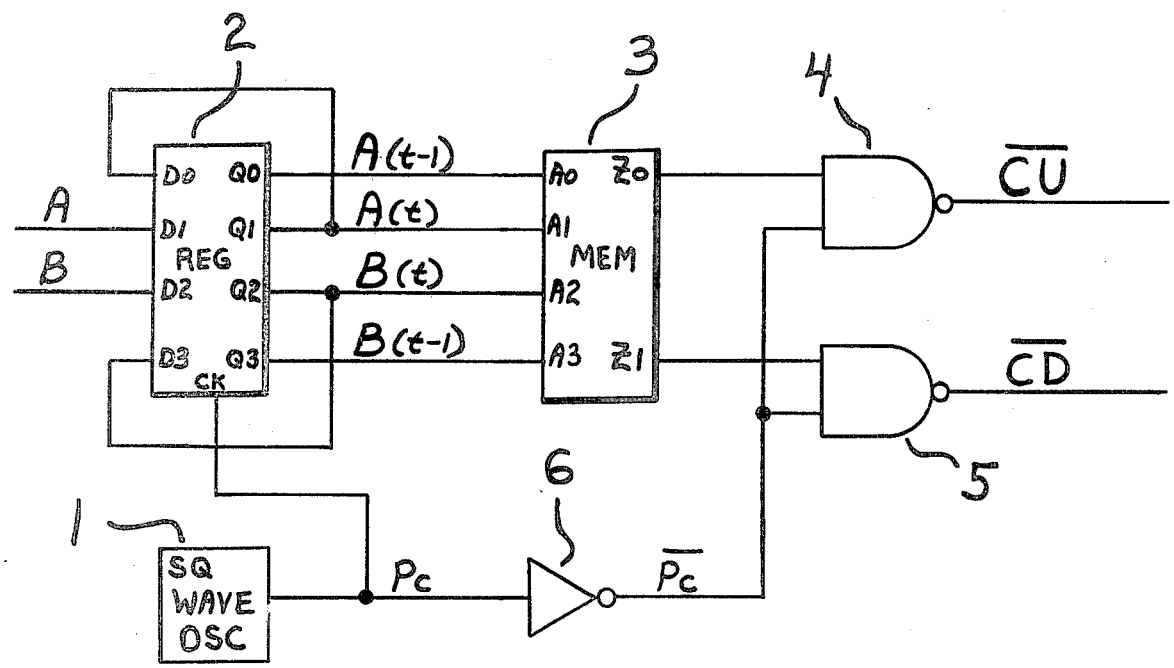
FIG. 1 is an electronic schematic diagram illustrating a preferred embodiment of this invention.
FIG. 2 is a tabular representation of logic conditions in accordance with the schematic shown in FIG. 1.

In FIG. 1 the output of square-wave oscillator 1 which is the system clock pulse (Pc) is fed both to dual D-Type Register 2 and also to gates 4 and 5 by way of inverter 6. In operation, quadrature-phased signals A and B are fed to flip-flops D0 and D1 of register 2. The outputs of these flip-flops Q0 and Q1 are fed both to static memory 3 and to flip-flops D0 and D1 respectively of register 19. At any rising edge of Pc samples are taken of A and B which appear at outputs Q0 and Q1 of Register 2 as A (t) and B (t) while simultaneously the previous states of Q0 and Q2 of Register 2, which resulted from the last rising edge of Pc, are clocked into flip-flops D0 and D1 of Register 19, appearing at outputs Q0 and Q1 of Register 19 as A(t-1) and B(t-1). These four signals, A(t), B(t), A(t-1) and B(t-1) which represent quadrature signals A and B as sampled in both present and previous sequential time states are now fed to static memory 3 where they are compared according to the tabular representation of logic states as shown in FIG. 2. It should be noted that this figure is identical to FIG. 16 of the co-pending application. During the time that Pc is in the high state the outputs of register 2 are allowed to settle and the access time of static memory 3 is allowed for. Pc then makes a negative transition, and while Pc is thusly low, its complement $\overline{Pc}$ is nand-ed in gates 4 and 5 with the outputs of memory 3 (Z0 and Z1) thereby producing signals $\overline{CU}$ and $\overline{CD}$ which are suitable for driving up/down counter 2. At the next rising edge of Pc the process starts again as described above.

These count pulses $\overline{CU}$ (count up) and $\overline{CD}$ (count down) will always appear with a repetition rate which is four times the rate of either input signal A or B. This is inherent since there are four logic state changes of signal A versus signal B during one complete cycle of either A or B. This is evident from FIG. 2 and was described in great detail in the co-pending application. Also described with full explanation in the co-pending application was the fact that for the decoder outputs to accurately describe the quadrature input signals, the input signals must be sampled at a rate which is at least four times the maximum operational rate of change of either of the two input signals.

Static momory 3, which compares present and past logic states to determine if a change in the input signals has occurred, could be implemented in many ways. In fact any digital architecture which implements the logic state table shown in FIG. 2 can be used including that of a Read Only Memory, Programmable Logic Array, Digital Multiplexer, or just an array of simple gates.

Any of the existing semiconductor technologies might be utilized to implement the circuit shown in FIG. 1.

Two technologies that lend themselves well to this circuit are CMOS and I²L due to their ability to operate at various power supply voltage levels. A number of semiconductor technologies including these just mentioned and TTL could be used to create a monolithic implementation of the circuit of FIG. 1 where all of the decoder circuitry except for possibly the capacitor in the oscillator section could be put on the same IC chip. CMOS would lend itself especially well to such an implementation as the oscillator frequency would tend to be stable over a large range of power supply voltages.

Figure 3:
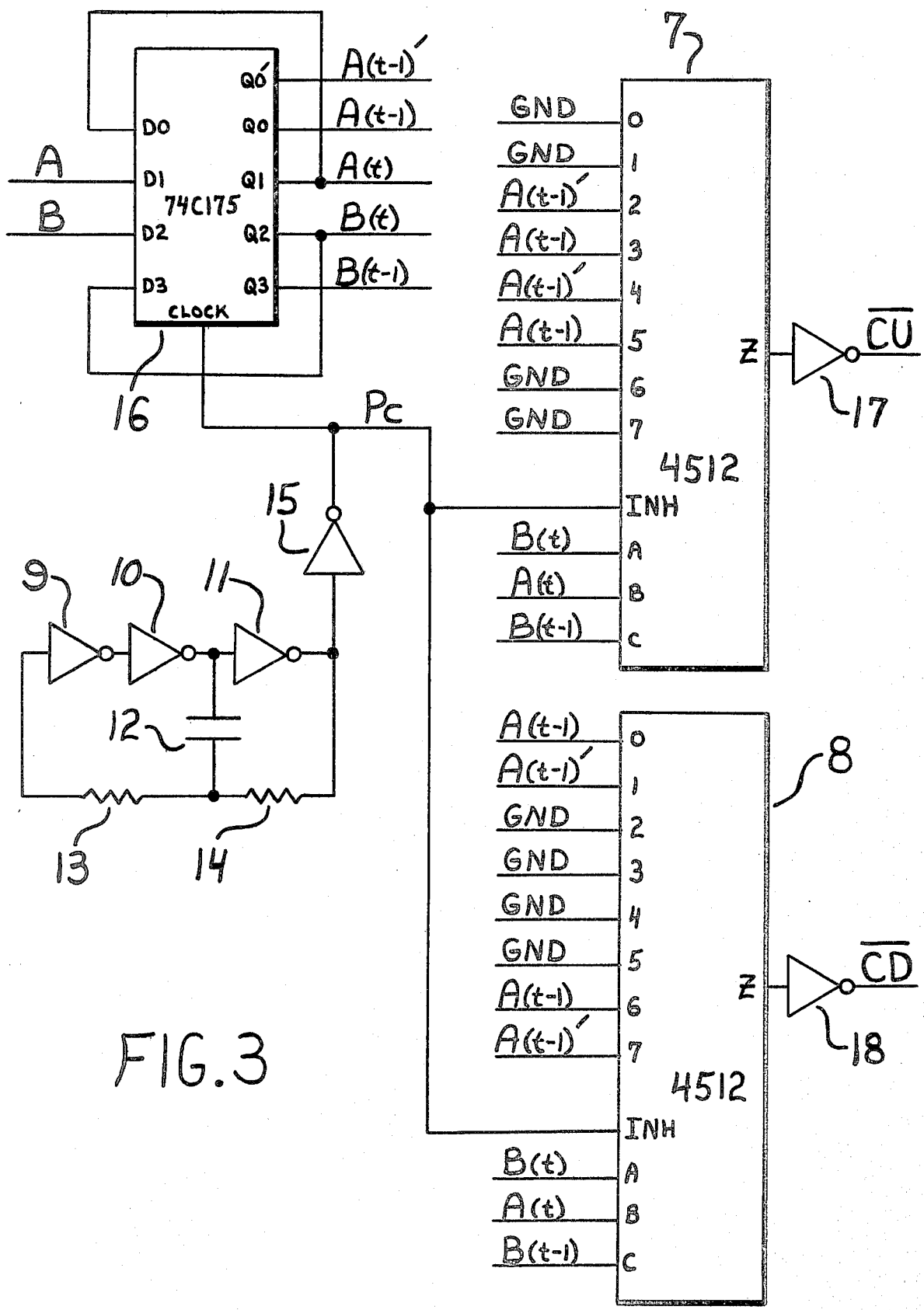
FIG. 3 is an electronic schematic diagram illustrating a practical implementation of the circuitry presented in FIG. 1.

A practical implementation of FIG. 1 is shown in FIG. 3. FIG. 3 utilizes readily available MSI CMOS components and employs digital multiplexers 7 and 8 to perform the function of static memory 3 of FIG. 1. Inverters 9, 10, and 11 in conjunction with capacitor 12 and resistors 13 and 14 comprise a square wave oscillator. Inverter 15 serves as a buffer to drive both quad register 16 which is equivalent to Register 2 and 19 of FIG. 1, and multiplexers 7 and 8. The functions of gates 4 and 5 of FIG. 1 are performed internally to 7 and 8 by way of the INH (inhibit) pin while inverters 17 and 18 are necessary both to produce the proper polarity of the decoder outputs $\overline{CU}$ and $\overline{CD}$ for driving customary types of up/down counters and to provide extra drive capability for interfacing with other logic families such as TTL. A popular choice for an up/down counter at this time is the 74192/193 type which requires the separate, negative-going count-up and count-down pulses as shown in FIG. 3. Other types of up/down counters require one signal for up/down count mode and another signal acting as a count pulse for either mode. It should be obvious that with a different logic state tablulation for FIG. 2 and slight changes in the output configuration of FIG. 1, the requirements of this alternate type of up/down counter can be easily accomadated.

Resort may be had to such further modifications and equivalents as fall within the spirit of the invention and the scope of the appended claims, the first of which retains the scope and definition of claim 22 of co-pending application No. 713,854, now U.S. Pat. No. 4,079,251, as it pertains to the present invention.

What is claimed is:

1. An electronic circuit for decoding rate and direction information from a pair of quadrature-phased electronic signals comprising:
   a square-wave oscillator for producing sampling pulses;
   first register means responsive to said quadrature-phased signals and to said sampling pulses for storing sampled states of said quadrature-phased electronic signals;
   second register means responsive to said first register means and said sampling pulses for storing the sampled states of said quadrature-phased signals which had been previously stored by said first register means;
   static memory means connected to perform a comparing operation on the outputs of said first and second register means; and
   digital logic means responsive to said static memory means and said sampling pulses providing appropriate signals for incrementing or decrementing an up/down counter means according to the comparison performed by said static memory means.

* * * * *